United States Patent
Wang

(10) Patent No.: US 8,312,919 B2
(45) Date of Patent: Nov. 20, 2012

(54) TRAY FOR VACUUM DEPOSITION APPARATUS

(75) Inventor: Chung-Pei Wang, Tucheng (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 696 days.

(21) Appl. No.: 12/494,283

(22) Filed: Jun. 30, 2009

(65) Prior Publication Data
US 2010/0122803 A1   May 20, 2010

(30) Foreign Application Priority Data

Nov. 17, 2008   (CN) .................. 2008 1 0305592

(51) Int. Cl.
F28F 7/02   (2006.01)
F28F 3/12   (2006.01)

(52) U.S. Cl. .................. 165/138; 165/168; 165/80.4

(58) Field of Classification Search .................. 165/138, 165/142, 168, 169, 80.4, 80.5
See application file for complete search history.

(56) References Cited

U.S. PATENT DOCUMENTS 1,813,057 A * 7/1931 Key .............................. 165/142

FOREIGN PATENT DOCUMENTS

CN   101089232 A   12/2007
JP   5-125534 A   5/1993

* cited by examiner

*Primary Examiner* — Teresa Walberg
(74) *Attorney, Agent, or Firm* — Altis Law Group, Inc.

(57) ABSTRACT

A tray for a vacuum deposition apparatus includes a base having an upper surface, a number of cooling pipes fixed to the base each having a plurality of alternately arranged cooling portions and conduits, and a number of engaging members. The cooling portions protrude from the upper surface and each has a cooling channel therein. Two ends of the cooling channel communicate with two adjacent conduits. Each of the engaging members each has a hole surrounding a corresponding cooling portion therein.

20 Claims, 4 Drawing Sheets

TRAY FOR VACUUM DEPOSITION APPARATUS

BACKGROUND

1. Technical Field

The present invention disclosure relates generally to trays, in particular, to a tray for a vacuum deposition apparatus.

2. Discussion of Related Art

With the ongoing development of optical imaging technology, camera modules are now widely used in a variety of electronic devices, such as digital cameras and mobile phones.

A camera module generally includes a barrel holder, a barrel threadedly engaged with the barrel holder, and a number of optical members (i.e., optical lenses, filters, and spacers) received in the barrel, and an image sensor disposed at an end of the barrel holder. Generally, the barrel holder is comprised of polymer material, which is pervious to electro magnetic waves. To reduce electro magnetic interference (EMI) to the image sensor, an EMI shielding coating is required on an outer surface of the barrel holder.

Typically, a vacuum deposition process is employed to deposit the EMI shielding coating. However, during the deposition process, temperature of the barrel holder inevitably increases due to bombardment of metal particles, and the barrel holder may deform.

Therefore, what is needed is to provide an apparatus or means which is capable of overcoming the aforementioned problems.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. In the drawings, all the views are schematic.

DETAILED DESCRIPTION OF EMBODIMENTS

Various embodiments of a tray for a vacuum deposition apparatus will be described in detail with reference to the accompanying drawings.

Figure 1:
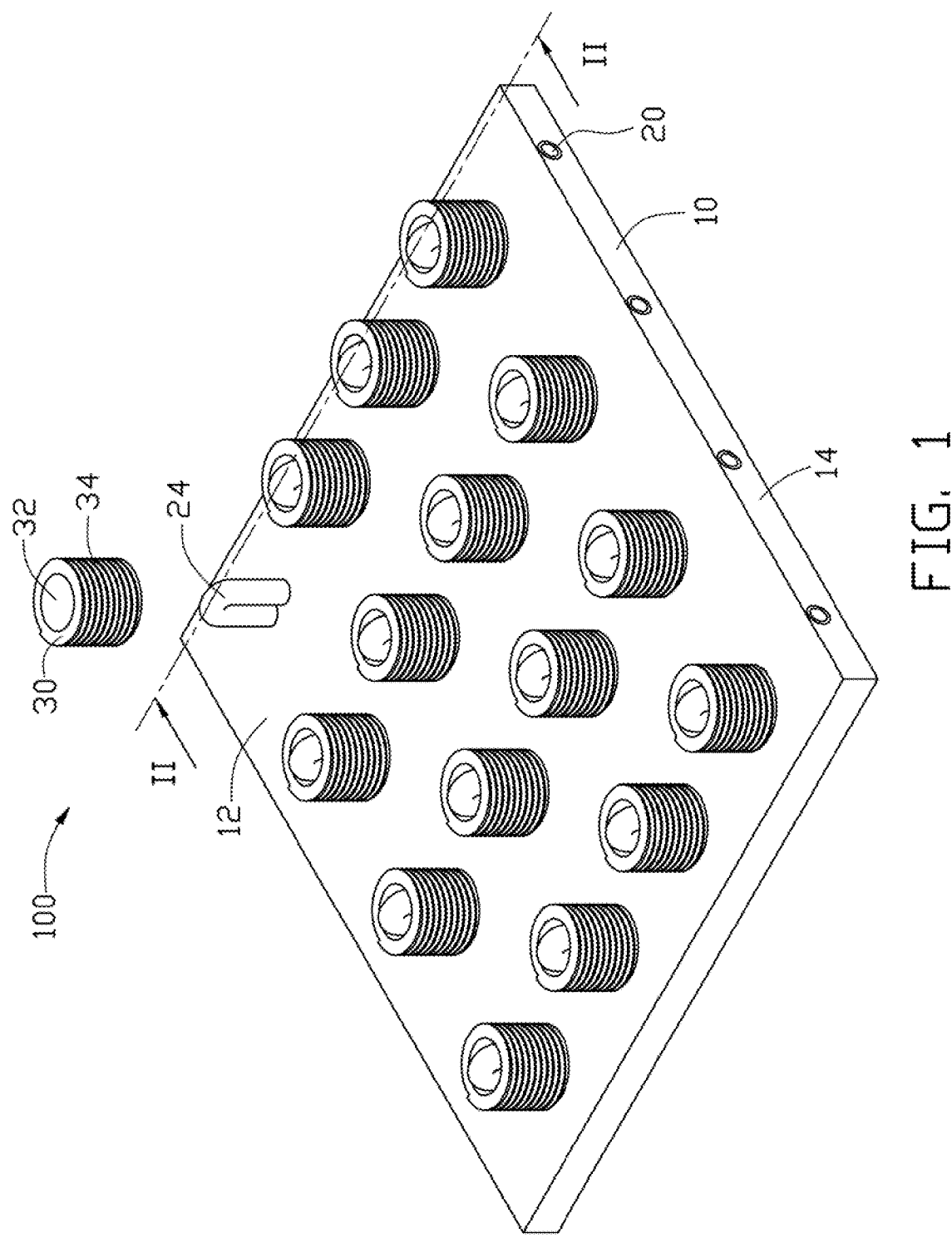
FIG. 1 is an isometric view showing a tray for a vacuum deposition apparatus in accordance with a first embodiment.
Figure 2:
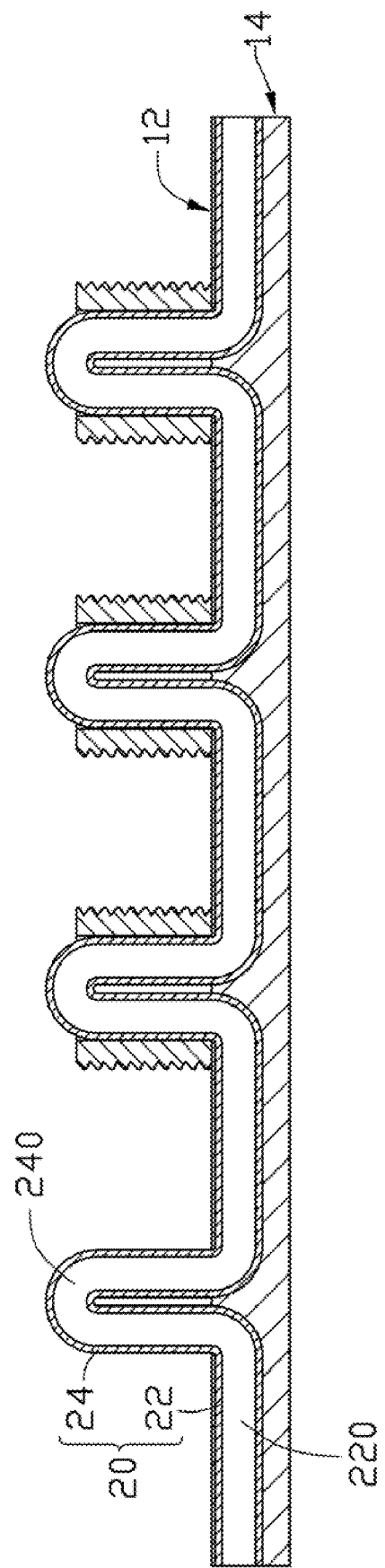
FIG. 2 is a cross-sectional view of FIG. 1 taken along line II-II.

Referring to FIGS. 1 and 2, a tray 100 provided in a first embodiment includes a base 10, a number of cooling pipes 20, and a number of engaging members 30.

The base 10 includes an upper surface 12, and two opposite side surfaces 14 adjoining the upper surface 12. Each of the cooling pipes 20 extends through the two opposite side surfaces 14, and consists of a number of alternately arranged conduits 22 and cooling portions 24. The conduits 22 are embedded in the base 10, and the cooling portions 24 protrude from the upper surface 12 of the base 10. Each of the conduits 22 defines a fluid passage 220 therein, and each of the cooling portions 24 defines a cooling channel 240 therein. Each of the cooling portions 24 and two adjacent conduits 22 are integrally formed into a unitary piece. Two ends of the cooling channel 240 communicate with two adjacent fluid passages 220. In the present embodiment, the cooling pipes 20 are parallel to each other, the conduits 22 in a corresponding cooling pipe 20 is aligned with a straight line, and the conduits 22 in different cooling pipes 20 are parallel to each other. Each of the cooling portions 24 has bends thereby defining an "n" shaped cooling channel 240.

Each of the engaging members 30 is detachably arranged on the upper surface 12, and defines a hole 32 surrounding the corresponding cooling portion 24 therein. That is, each of the engaging members 30 is detachably disposed around a corresponding cooling portion 24. Typically, referring to FIG. 3, a barrel holder 40 has a threaded outer surface 42 for engaging with a lens barrel and an outer surface 44. As such, the barrel holder 40 can be easily screwed onto the engaging members 30.

Figure 3:
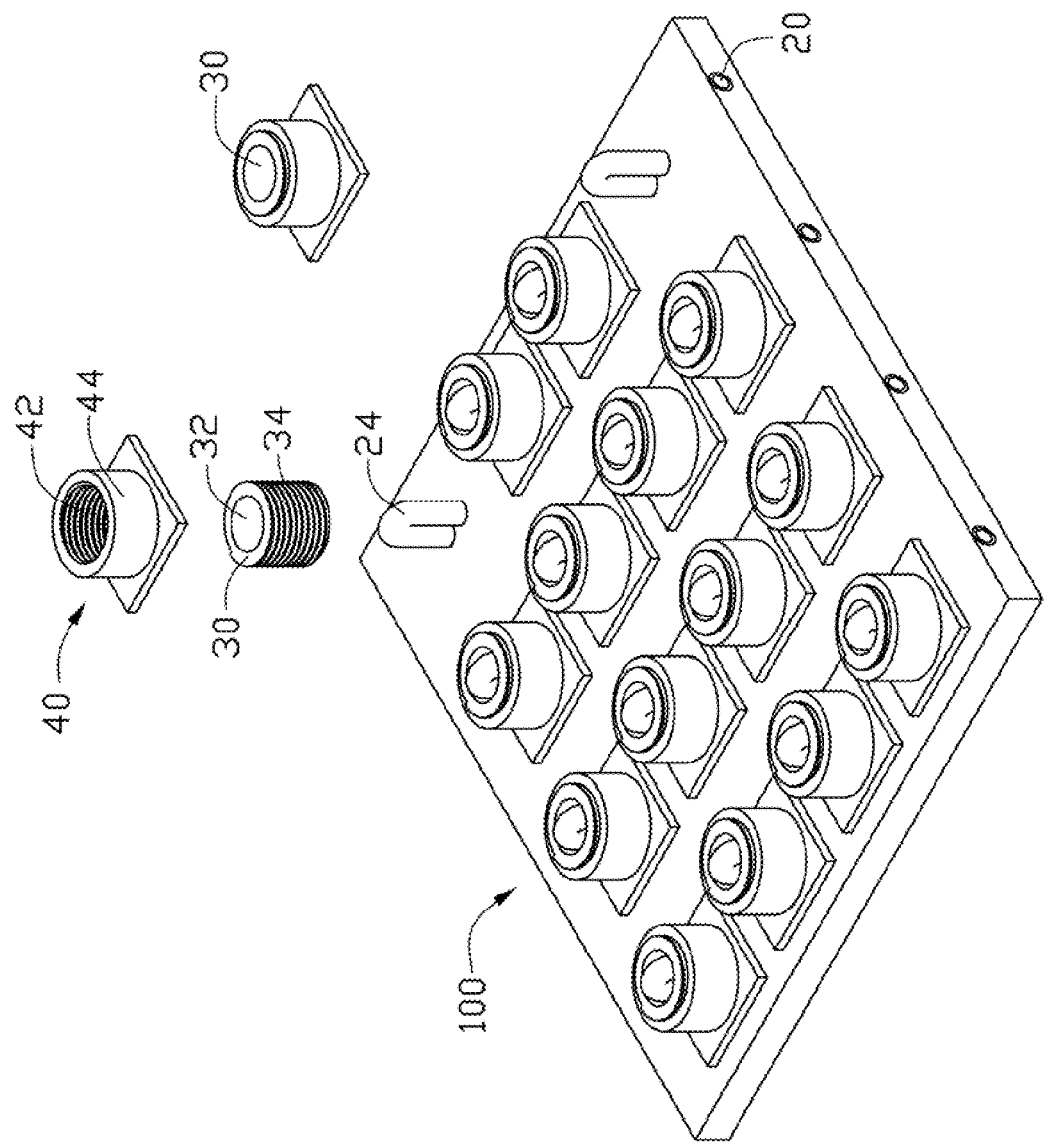
FIG. 3 is similar to FIG. 1 but showing the tray carrying a number of barrel holders thereon.

As shown in FIG. 3, when barrel holders 40 are carried on the tray 100, a cooling fluid can be supplied to the cooling pipes 20. The cooling fluid can be any suitable fluid for adsorbing heat. The cooling fluid can be selected from the group consisting of water, ammonia, methanol, acetone, heptane, and any combination thereof. The cooling fluid flows through the cooling channel 240 thereby cooling the barrel holder disposed around a corresponding engaging member 30. As a result, temperature at outer surfaces of the barrel holders 40 can be maintained at a low level. Accordingly, the barrel holders 40 don't deform during the vacuum deposition process.

Figure 4:
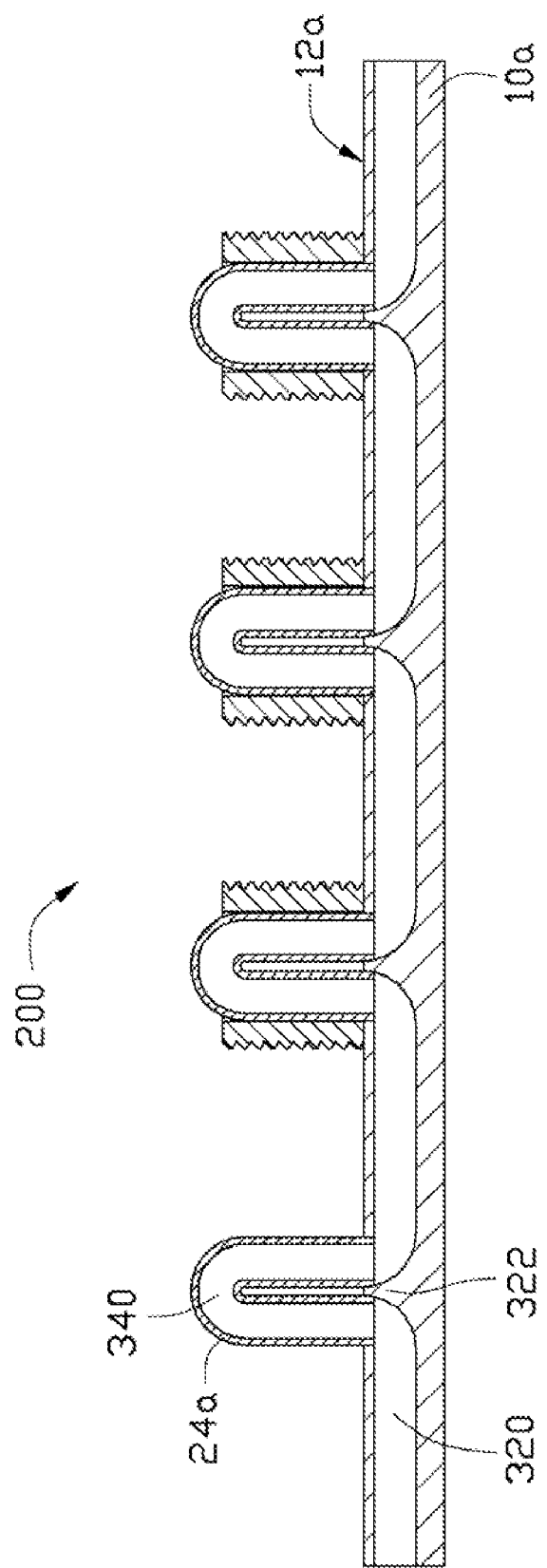
FIG. 4 is a cross-sectional view of a tray in accordance with a second embodiment.

Referring to FIG. 4, a tray 200 provided in a second embodiment is similar to the tray 100, except that there are no additional conduits embedded in the base 10a. The fluid passages 320 are holes defined in the base 10a. Two ends of each of the cooling portions 24a are inserted into the base 10a. In detail, one end of each the cooling portion 24a is inserted into one of the two adjacent fluid passages 320, and the other end of each cooling portion 24a is inserted into the other fluid passages 320 of the adjacent fluid passages 320. Each of the cooling portions 24a defines a cooling channel 340, and two ends of each cooling channel 340 communicate with two adjacent fluid passages 320. A guide protrusion 322 is formed between each two adjacent fluid passages 320, and extends in a direction towards a corresponding cooling portion 24a. When fluid flows in the flow passages, the guide protrusion 322 guides the fluid into the cooling channel 340. In the present embodiment, a distal end of the guide protrusion 322 is located between two ends of the cooling portion 24a, and isolates two fluid passages from each other. In other words, one end of the guide protrusion 322 is substantially coplanar with the upper surface 12a. In this condition, all the fluid in the flow passages 320 flows through the cooling channel 340.

It is to be understood, however, that even though numerous characteristics and advantages have been set forth in the foregoing description of embodiments, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A tray, comprising:
    a base comprising an upper surface;
    a plurality of cooling pipes fixed to the base each consisting of a plurality of alternately arranged cooling portions and conduits, the cooling portions protruding from the upper surface each defining a cooling channel therein, two ends of the cooling channel communicating with two adjacent conduits, and the conduits being embedded in the base; and a plurality of engaging members detachably arranged on the upper surface, and each engaging member defining a hole surrounding the corresponding cooling portion therein.

2. The tray of claim 1, wherein the base comprises two opposite side surfaces adjoining the upper surface, the cooling pipes extends through the two opposite side surfaces.

3. The tray of claim 2, wherein each of the engaging members comprises a threaded outer surface.

4. The tray of claim 3, wherein the cooling pipes as a whole are parallel to each other.

5. The tray of claim 3 wherein the cooling pipes contains a cooling fluid therein.

6. The tray of claim 5, wherein the cooling fluid is selected from the group consisting of water, ammonia, methanol, acetone, heptane, and any combination thereof.

7. The tray of claim 3, wherein each of the cooling portions and two adjacent conduits are integrally formed into a unitary piece.

8. The tray of claim 3 wherein the conduits in a common one of the cooling pipes are aligned with a straight line.

9. The tray of claim 8, wherein the conduits in different cooling pipes are parallel to each other.

10. A tray, comprising:
a base comprising a plurality of fluid passages therein, the base comprising an upper surface;
a plurality of cooling portions protruding from the upper surface, each of the cooling portions defining a cooling channel with two ends thereof communicating with two adjacent fluid passages; and
a plurality of engaging members detachably arranged on the upper surface, and each engaging member defining a hole surrounding the corresponding cooling portion therein.

11. The tray of claim 10, further comprising a plurality of conduits embedded in the base each defining the corresponding fluid passage.

12. The tray of claim 11, wherein each of the engaging members comprises a threaded outer surface.

13. The tray of claim 12, wherein the conduits in a common one of the cooling pipes are aligned with a straight line.

14. The tray of claim 13, wherein the conduits in different cooling pipes are parallel to each other.

15. The tray of claim 10, wherein each of the engaging members comprises a threaded outer surface.

16. The tray of claim 15, wherein the fluid passages and the cooling channels contains a cooling fluid therein, the fluid passages are holes defined in the base, one end of each the cooling portion is inserted into one of the two adjacent fluid passages, and the other end of each cooling portion is inserted into the other fluid passage of the adjacent fluid passages.

17. The tray of claim 16, wherein the cooling fluid is selected from the group consisting of water, ammonia, methanol, acetone, heptane, and any combination thereof.

18. The tray of claim 16, wherein a guide protrusion is formed between each two adjacent fluid passages, the guide protrusion extends in a direction towards the corresponding cooling portion.

19. The tray of claim 18, wherein the guide protrusion partitions the two adjacent fluid passages from each other.

20. The tray of claim 18, wherein a distal end of the guide protrusion is located between two ends of the corresponding cooling porton.

* * * * *